(12) United States Patent
Prat et al.

(10) Patent No.: US 6,953,649 B2
(45) Date of Patent: Oct. 11, 2005

(54) PHOTOSENSITIVE COMPOSITION FOR PHOTORESIST MANUFACTURE

(75) Inventors: Evelyne Prat, Pantin (FR); Mathias Destarac, Paris (FR)

(73) Assignee: Rhodia Chimie, Boulogne Billancourt (FR)

( * ) Notice: Subject to any disclaimer, the term of this patent is extended or adjusted under 35 U.S.C. 154(b) by 169 days.

(21) Appl. No.: 10/312,638

(22) PCT Filed: Jun. 1, 2001

(86) PCT No.: PCT/FR01/01708
§ 371 (c)(1),
(2), (4) Date: Mar. 19, 2003

(87) PCT Pub. No.: WO01/95034
PCT Pub. Date: Dec. 13, 2001

(65) Prior Publication Data
US 2003/0165769 A1 Sep. 4, 2003

(30) Foreign Application Priority Data
Jun. 5, 2000 (FR) .......................................... 00 07145

(51) Int. Cl.⁷ .......................... G03F 7/021; G03F 7/004
(52) U.S. Cl. .................... 430/176; 430/157; 430/270.1; 430/905; 525/212; 525/291
(58) Field of Search ................................ 430/157, 176, 430/270.1, 905; 525/212, 291

(56) References Cited

U.S. PATENT DOCUMENTS

| | | | | |
|---|---|---|---|---|
| 4,689,289 A | * | 8/1987 | Crivello .................. | 430/270.1 |
| 5,071,731 A | * | 12/1991 | Chen et al. ............... | 430/271.1 |
| 5,368,976 A | * | 11/1994 | Tajima et al. ............. | 430/176 |
| 5,556,734 A | * | 9/1996 | Yamachika et al. ...... | 430/270.1 |
| 5,625,020 A | * | 4/1997 | Breyta et al. ............. | 526/329.2 |
| 5,698,361 A | * | 12/1997 | Aoshima .................. | 430/176 |
| 6,063,542 A | * | 5/2000 | Hyeon et al. ............. | 430/270.1 |
| 6,379,874 B1 | * | 4/2002 | Ober et al. ................ | 430/322 |
| 6,692,884 B2 | * | 2/2004 | Fujimori et al. .......... | 430/170 |

FOREIGN PATENT DOCUMENTS

WO   WO 98 58974   12/1998   ......... C08F/293/00

OTHER PUBLICATIONS

Turner S R, Blevins R W: American Chemical Society, Div. Pol. Chem., vol. 29, no. 2, Sep. 1988, pp. 6–7, XP00986419 whole document.

Okawara M et al: Bulletin of the Tokyo Institute of Technology, JP. Tokyo, no. 78, 1966, pp. 1–16, XP002049822, ISSN.0366–3736—Abstract.

International Search Report.

* cited by examiner

*Primary Examiner*—John S. Chu

(57) ABSTRACT

The invention concerns a novel photosensitive composition for photoresist and a system comprising a substrate and a photoresist obtained from said novel composition. The photosensitive composition for photoresist comprises a copolymer with hydrophobic blocks whereof at least one block is an hydrophobic block capable of generating a hydrophilic block and comprising at its end a group selected among dithioesters, thioesters-thiones, dithiocarbamates and xanthates, and a photoactive compound capable of generating under the effect of a radiation an active species reacting with the hydrophobic block to generate the hydrophilic block.

17 Claims, No Drawings

PHOTOSENSITIVE COMPOSITION FOR PHOTORESIST MANUFACTURE

This application is an application under 35 U.S.C. Section 371 of International Application Number PCT/FR01/10708 filed on Jun. 1, 2001.

The present invention relates to a novel photosensitive composition for photoresists and to a system comprising a substrate and a photoresist obtained from this novel composition.

In the field of microelectronics, the development of electronic systems which make it possible to increase the information storage density on the system is always topical. When the systems are obtained by lithography, one means of increasing the density of information stored is to improve the lithographic resolution. This lithographic resolution becomes proportionally better as the photoresists used in these systems are exposed to low wavelengths.

Several types of photoresists exist. Novolak resins are commonly used as photoresists at exposures at 365 nm and linear phenolic resins, for example p-hydroxystyrene derivatives, are commonly used at exposures at 248 nm.

These photoresist compositions comprise a photoactive compound and a polymer having specific side groups. The photoactive compound, under the effect of the radiation, releases an active species capable of releasing the side groups of the polymer to produce polymer chains with a very different polarity from the precursor polymer, rendering the latter partially soluble in the developer. The photoactive compound is generally an acid generator, the acid thus generated catalysing the reaction for the separation of the side groups of the polymer. Starting from a hydrophobic precursor polymer, the reactive species generated by the exposure makes it possible to selectively modify the polarity of the polymer, rendering the exposed parts hydrophilic. By the treatment of the polymer obtained with a developer, either a positive photoresist is obtained, when the developer is a polar solvent, for example alcohol, or an aqueous solution, preferably a basic aqueous solution, or a negative photoresist is obtained, by using an organic developer.

Novolak resins, exposed to wavelengths of less than 365 nm, or phenolic resins, exposed to a wavelength of less than 248 nm, strongly absorb these radiation values, which reduces the activity of the photoactive compound present between the surface and the thickness of the polymer.

To obtain good resolution at wavelengths of less than 248 nm, the use is known of methacrylic derivatives, for example poly(tert-butyl methacrylate), or norbornene derivatives. These photoresists can be used at an exposure wavelength of 193 nm.

By the use of such compositions on semiconductor substrates, microelectronic systems are obtained which have an improved resolution with respect to the resolution obtained with novolak resins at 365 nm or phenolic resins at 248 nm.

However, the photoresists based on these methacrylates or norbornene derivatives exhibit low mechanical strength during the chemical engraving stage.

Photosensitive compositions comprising specific block polymers have also been disclosed. However, the polymers disclosed in these examples are not easy to manufacture industrially.

The aim of the present invention is to provide novel photosensitive compositions for photoresists which can be used with radiation extending from the far UV to the visible.

The second aim of the invention is to provide novel photosensitive compositions which make it possible to obtain photoresists which have good mechanical properties while retaining a high sensitivity.

Another aim of the invention is to provide electronic systems by lithography which have a high resolution and a high contrast.

These aims are achieved by the present invention, which relates to a photosensitive composition for photoresists which comprises a copolymer with hydrophobic blocks, at least one block of which is a hydrophobic block capable of generating a hydrophilic block, which comprises, at its end, a group chosen from dithioesters, thioethers-thiones, dithiocarbamates and xanthates, and a photoactive compound capable of generating, under the effect of radiation, an active species which reacts with the hydrophobic block to generate the hydrophilic block.

This type of block copolymer is advantageously obtained by a controlled radical polymerization process which is easy to implement industrially and which makes it possible to obtain block copolymers with a low polydispersity index. It makes it possible to obtain copolymers from monomers of varied nature. The chemical and mechanical properties of the photoresists obtained from these block copolymers can thus be widely varied.

In the context of the invention, a photoresist composition is a photosensitive composition used for the transfer of an image onto a substrate.

According to the invention, the hydrophobic block capable of generating a hydrophilic block comprises side groups which, under the action of the active species, separate from the polymer to generate the hydrophilic block.

This partial modification of the polarity of the polymer makes possible the dissolution of the polymer either in a polar solvent, for positive photoresists, or in a nonpolar solvent, for negative photoresists, during development.

In the continuation of the description, reference is made to positive photoresists. However, this teaching is directly applicable to negative photoresists.

The preferred polymers of use in the present invention are polymers obtained by the radical route which comprise side groups which can be subjected to acidolysis, making it possible to produce macromolecular chains with a different polarity from that of the precursor polymer with a hydrophobic block.

According to a first embodiment of the present invention, the hydrophobic block capable of generating a hydrophilic block under the effect of the active species can be obtained from at least one ethylenically unsaturated monomer chosen from (meth)acrylic esters.

The term "(meth)acrylic esters" denotes esters of acrylic acid and of methacrylic acid with hydrogenated or fluorinated $C_1$–$C_{12}$ alcohols, preferably $C_1$–$C_8$ alcohols. Mention may be made, among the compounds of this type, of: methyl acrylate, ethyl acrylate, propyl acrylate, n-butyl acrylate, isobutyl acrylate, 2-ethylhexyl acrylate, t-butyl acrylate, methyl methacrylate, ethyl methacrylate, n-butyl methacrylate or isobutyl methacrylate. t-Butyl acrylate, t-butyl methacrylate, tetrahydropyranyl methacrylate, heptafluoropropylmethyl methacrylate or pentadecafluoroheptyl methacrylate are particularly preferred.

According to a second embodiment, the hydrophobic block is obtained from styrene monomers chosen from alkoxystyrenes. Such monomers are, for example, p-t-butoxystyrene, p-acetoxystyrene, p-trimethylsilyloxystyrene or m-t-butoxystyrene.

The preferred polymers are polymers comprising a poly(p-t-butoxycarbonyloxy-α-methylstyrene), poly(p-t-butoxycarbonyloxystyrene), poly(t-butyl p-vinylbenzoate), poly(t-butyl isopropenylphenyloxyacetate), poly(t-butyl methacrylate), poly(t-butoxystyrene) or poly(p-acetoxystyrene) block.

When the side groups comprise an ester functional group, the hydrophilic block resulting from the action of the active species comprises groups with an acid functional group. When the side groups comprise an alkoxy functional group, the resulting hydrophilic block comprises hydroxyl functional groups. The preferred polymers-are polymers comprising a hydrophobic block having side groups with an ester functional group, for example a group which is the t-butyl ester of the carboxylic acid, the t-butyl carbonate of hydroxystyrene, it being possible for these groups to be substituted by trityl, benzyl or benzhydryl radicals.

The polymer of the invention can be a homopolymer or a multiblock copolymer, preferably a diblock copolymer.

According to a preferred embodiment, the block copolymer comprises a hydrophobic block which does not generate a hydrophilic block under the action of the active species. The hydrophobic block which does not generate a hydrophilic block can be obtained from monomers with ethylenic unsaturations chosen from (meth)acrylic ester or styrene monomers, alone or as a mixture. These monomers can be of the same type as those described above, except that they do not comprise groups capable of generating a hydrophilic block under the conditions of use of a photoresist.

According to a particularly advantageous embodiment, the block copolymer is a diblock copolymer, the second block of which is a hydrophobic block which does not generate a hydrophilic block under the action of the active species. When such a copolymer is used, during the development of the photoresist there exists an effect of micellization of the system which promotes the kinetics of development of the photoresist.

Furthermore, the use of such a polymer makes it possible to increase the amount of hydrophobic monomers which do not generate a hydrophilic block in the block copolymer and thus to obtain photoresists which have an improved dimensional stability.

It is possible, by the choice of the nature of the monomers participating in the composition of the block copolymer and the polydispersity of this copolymer, to vary the chemical and/or mechanical properties of the photoresist layer.

In the context of the invention, the definition of "block" includes both the blocks obtained from a single type of monomer and those composed of a random polymer. For example, a diblock copolymer can comprise a first block obtained by styrene and a second block composed of a random polymer of two methacrylate monomers.

According to a specific embodiment, the block copolymer corresponds to the following formula (I)

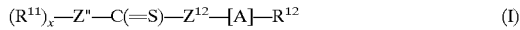

(I)

in which formula:

$Z^{11}$ represents C, N, O, S or P, $Z^{12}$ represents S, $R^{11}$ and $R^{12}$, which are identical or different, represent:
(i) an optionally substituted alkyl, acyl, aryl, alkene or alkyne group, or
(ii) a carbonaceous ring which is saturated or unsaturated and which is optionally substituted or aromatic, or
(iii) an optionally substituted, saturated or unsaturated heterocycle,
it being possible for these groups and rings (i), (ii) and (iii) to be substituted by substituted phenyl groups, substituted aromatic groups or the following groups: alkoxycarbonyl or aryloxycarbonyl (—COOR), carboxyl (—COOH), acyloxy (—O₂CR), carbamoyl (—CONR₂), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR₂), halogen, allyl, epoxy, alkoxy (—OR), S-alkyl, S-aryl, or groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts), R representing an alkyl or aryl group, x corresponds to the valency of $Z^{11}$ or else x has a value 0 and, in this case, $Z^{11}$ represents a phenyl, alkene or alkyne radical optionally substituted by an optionally substituted alkyl, acyl, aryl, alkene or alkyne group; a carbonaceous ring which is optionally substituted and which is saturated, unsaturated or aromatic; a heterocycle which is optionally substituted and which is saturated or unsaturated; alkoxycarbonyl or aryloxycarbonyl (—COOR), carboxyl (—COOH), acyloxy (—O₂CR), carbamoyl (—CONR₂), cyano (—CN), alkylcarbonyl, alkylarylcarbonyl, arylcarbonyl, arylalkylcarbonyl, phthalimido, maleimido, succinimido, amidino, guanidino, hydroxyl (—OH)., amino (—NR₂), halogen, allyl, epoxy, alkoxy (—OR), S-alkyl or S-aryl groups; or groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts);

A represents a polymer chain comprising the hydrophobic block capable of generating a hydrophilic block.

This type of polymer has been disclosed in Patent Applications WO 98/58974 and WO 99/35178. Reference can thus be made to the descriptions of these two patent applications for the preferred definitions of the various groups and radicals and for their preparation.

According to a second embodiment of the invention, the block copolymer corresponds to the following formulae (IIa) and (IIb):

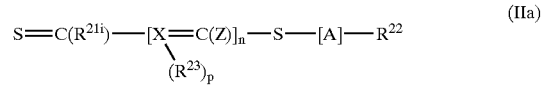

(IIa)

and/or

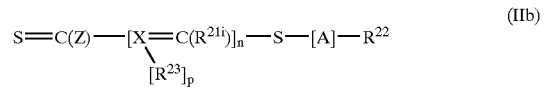

(IIb)

in which formulae:

X represents an atom chosen from N, C, P or Si, $R^{22}$ represents:
(i) an optionally substituted alkyl, acyl, aryl, alkene or alkyne group, or
(ii) a carbonaceous ring which is saturated or unsaturated and which is optionally substituted or aromatic, or
(iii) a heterocycle which is saturated or unsaturated and which is optionally substituted or aromatic,
it being possible for these groups and rings (i), (ii) and (iii) to be substituted by substituted phenyl groups, substituted aromatic groups or the following groups: alkoxycarbonyl or aryloxycarbonyl (—COOR), carboxyl (—COOH), acyloxy (—O₂CR), carbamoyl (—CONR₂), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR₂), halogen, allyl, epoxy, alkoxy (—OR), S-alkyl, S-aryl, organosilyl or groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts), R representing an alkyl or aryl group, Z, $R^{21i}$ and $R^{23}$, which are identical or different, are chosen from:
a hydrogen atom,
an optionally substituted alkyl, acyl, aryl, alkene or alkyne group,
a carbonaceous ring which is saturated or unsaturated and which is optionally substituted or aromatic,
an optionally substituted, saturated or unsaturated heterocycle,
alkoxycarbonyl or aryloxycarbonyl (—COOR), carboxyl (—COOH), acyloxy (—O₂CR), -carbamoyl (—CONR₂), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR₂), halogen, allyl, epoxy, alkoxy (—OR), S-alkyl, S-aryl or organosilyl groups, R representing an alkyl or aryl group, groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts), n>0, i varies from 1 to n, p is equal to 0, 1 or 2,-depending upon the valency of X, furthermore,
if X=C, then Z is not an S-alkyl or S-aryl group,
the $R^{1i}$ group, with i=n, is not an S-alkyl or S-aryl group, A represents a polymer chain comprising the hydrophobic block capable of generating a hydrophilic block.

According to a third embodiment of the invention, the block copolymer corresponds to the following formula (III):

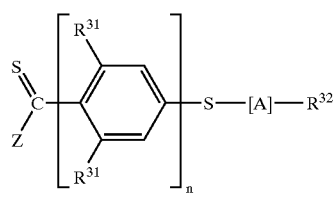

(III)

in which
X represents an atom chosen from N, C, P or Si,
$R^{32}$ represents:
(i) an optionally substituted alkyl, acyl, aryl, alkene or alkyne group, or
(ii) a carbonaceous ring which is saturated or unsaturated and which is optionally substituted or aromatic, or
(iii) a heterocycle which is saturated or unsaturated and which is optionally substituted or aromatic, it being possible for these groups and rings (i), (ii) and (iii) to be substituted by substituted phenyl groups, substituted aromatic groups or the following groups: alkoxycarbonyl or aryloxycarbonyl (—COOR), carboxyl (—COOH), acyloxy (—O₂CR), carbamoyl (—CONR₂), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR₂), halogen, allyl, epoxy, alkoxy (—OR), S-alkyl, S-aryl, organosilyl or groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts), R representing an alkyl or aryl group, Z is chosen from:
a hydrogen atom,
an optionally substituted alkyl, acyl, aryl, alkene or alkyne group,
a carbonaceous ring which is saturated or unsaturated and which is optionally substituted or aromatic,
an optionally substituted, saturated or unsaturated heterocycle,
alkoxycarbonyl or aryloxycarbonyl (—COOR), carboxyl (—COOH), acyloxy (—O₂CR), carbamoyl (—CONR₂), cyano (—CN), alkylcarbonyl, alkylarylcarbonyl, arylcarbonyl, arylalkylcarbonyl, phthalimido, maleimido, succinimido, amidino, guanidino, hydroxyl. (—OH), amino (—NR₂), halogen, allyl, epoxy, alkoxy (—OR), S-alkyl, S-aryl or organosilyl groups, R representing an alkyl or aryl group, groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts), $R^{31}$, which are identical or different, are chosen from:
a hydrogen atom,
an optionally substituted alkyl, acyl, aryl, alkene or alkyne group,
a carbonaceous ring which is saturated or unsaturated and which is optionally substituted or aromatic,
an optionally substituted, saturated or unsaturated heterocycle,
alkoxycarbonyl or aryloxycarbonyl (—COOR), carboxyl (—COOH), acyloxy (—O₂CR), carbamoyl (—CONR₂), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR₂), halogen, allyl, epoxy, alkoxy (—OR), S-alkyl, S-aryl or organosilyl groups, R representing an alkyl or aryl-group, groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts), $SR^{32}$ groups, n>0, A represents a polymer chain comprising the hydrophobic block capable of generating the hydrophilic block.

According to a fourth embodiment of the invention, the block copolymer corresponds to the following formula (IV):

$$S=C(Z)-[C\equiv C]_n-S-[A]-R^{41} \qquad (IV)$$

in which formula:

R$^{41}$ represents:
(i) an optionally substituted alkyl, acyl, aryl, alkene or alkyne group, or
(ii) a carbonaceous ring which is saturated or unsaturated and which is optionally substituted or aromatic, or
(iii) a heterocycle which is saturated or unsaturated and which is optionally substituted or aromatic,
it being possible for these groups and rings (i), (ii) and (iii) to be substituted by substituted phenyl groups, substituted aromatic groups or the following groups: alkoxycarbonyl or aryloxycarbonyl (—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl, organosilyl or groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts),
R representing an alkyl or aryl group, Z, which are identical or different, are chosen from:
a hydrogen atom,
an optionally substituted alkyl, acyl, aryl, alkene or alkyne group,
a carbonaceous ring which is saturated or unsaturated and which is optionally substituted or aromatic,
an optionally substituted, saturated or unsaturated heterocycle,
alkoxycarbonyl or aryloxycarbonyl (—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl or organosilyl groups, R representing an alkyl or aryl group, groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts),
n>0,
A represents a polymer chain comprising the hydrophobic block capable of generating a hydrophilic block.

The polymers (IIa), (IIb), (III) and (IV) can be obtained by bringing into contact an ethylenically unsaturated monomer, at least one source of free radicals and at least one compound of formula (A), (B) or (C)

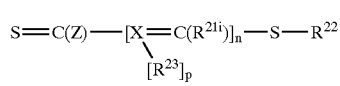  (A)

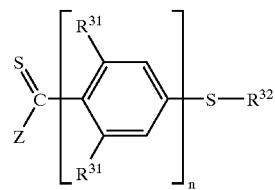  (B)

$$S\!=\!C(Z)\!-\![C\!\equiv\!C]_n\!-\!S\!-\!R^{41} \quad (C)$$

These polymers generally exhibit a polydispersity index of at most 2, preferably of at most 1.5.

The preparation of the di- or triblock polymers consists in repeating, once or twice, the implementation of the above described polymerization process using:
monomers different from the preceding implementation, and
instead of the compound of formula (A), (B) or (C), the block polymer resulting from the preceding implementation, referred to as the precursor polymer.

According to this process for the preparation of multi-block polymers, when it is desired to obtain homogeneous block polymers and not block polymers with a composition gradient and if all the successive polymerizations are carried out in the same reactor, it is essential for all the monomers used during this stage to be consumed before the polymerization of the following stage begins, thus before the new monomers are introduced.

As for the process for the polymerization of a monoblock polymer, this process for the polymerization of block polymers exhibits the advantage of resulting in block polymers exhibiting a low-polydispersity index. It also makes it possible to control the molecular mass of the block polymers.

According to a fifth embodiment of the invention, the mono-, di- or triblock polymer employed corresponds to the following formula:

$$S\!=\!C(OR^{51})\!-\!S\!-\![A]\!-\!R^{52} \quad (V)$$

in which formula:
R$^{51}$ represents:

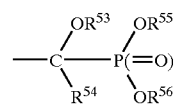

in which:
R$^{53}$ and R$^{54}$, which are identical or different, are chosen from halogen, =O, =S, —NO$_2$, —SO$_3$R, NCO, CN, OR, —SR, —NR$_2$, —COOR, O$_2$CR, —CONR$_2$ or —NCOR$_2$ groups with R representing a hydrogen atom or an alkyl, alkenyl, alkynyl, cycloalkenyl, cycloalkynyl, aryl, optionally condensed with an aromatic or nonaromatic heterocycle, alkylaryl, aralkyl or heteroaryl radical; these radicals can optionally be substituted by one or more identical or different groups chosen from halogens, =O, =S, OH, alkoxy, SH, thioalkoxy, NH$_2$, mono- or dialkylamino, CN, COOH, ester, amide or CF$_3$ and/or can optionally be interrupted by one or more atoms chosen from O, S, N or P; or from a heterocyclic group optionally substituted by one or more groups as defined above;

or $R^{53}$ and $R^{54}$ form, together with the carbon atom to which they are attached, a hydrocarbonaceous ring or a heterocycle;

$R^5$ and $R^{56}$, which are identical or different, represent a group as defined above for R or together form a $C_2$–$C_4$ hydrocarbonaceous chain optionally interrupted by a heteroatom chosen from O, S and N;

$R^{52}$ has the same definition as that given for $R^{53}$;

A represents a mono-, di- or triblock polymer.

According to a preferred alternative form, the $R^{53}$ groups are chosen from —$CF_3$, —$CF_2CF_2CF_3$, CN or $NO_2$.

Advantageously, $R^{54}$ represents a hydrogen atom.

The $R^{55}$ and $R^{56}$ radicals, which are identical or different, represent an alkyl radical, preferably a $C_1$–$C_6$ alkyl radical.

The polymers of formula (V) can be obtained by bringing into contact at least one ethylenically unsaturated monomer, at least one source of free radicals and at least one compound of following formulae:

$$S=C(OR^{51})-S-R^{52} \quad (A')$$
$$R^{'51}-(O-C(=S)-R^{52})_p \quad (B')$$
$$R^{'51}-(S-C(=S)-O-R^{51})_p \quad (C')$$

in which formulae:
$R^{51}$ and $R^{'51}$, which are identical or different, have the same definition as that given previously for $R^{51}$,
$R^{52}$ and $R^{'52}$, which are identical or different, have the same meaning as that given previously for $R^{52}$,
p represents an integer between 2 and 10.

The compounds of formula (A') can be obtained in particular by reaction of a carbonyl compound of formula $R^{53}$—C(=O)—$R^{54}$ with a phosphite of formula $(R^{55}O)HP(=O)(OR^{56})$. The resulting compound can subsequently be brought into contact with carbon disulphide in the presence of an alkoxide and then with a halide $R^{52}$—X.

The compounds of formulae (B') and (C') can be obtained by employing an equivalent principle but from polyhydroxylated compounds.

According to a specific embodiment, the dithioester, thioether-thione, dithiocarbamate and xanthate ends can be cleaved before being incorporated in the photoresist composition. This cleaving can be carried out by any known chemical modification technique, for-example that described by Mori et al. in J. Org. Chem. 34, 12, 1969, 4170, which describes the conversion of the xanthate end to a thiol, or those described by Barton et al. in J. Chem. Soc., 1962, 1967, from Raney nickel, by Udding et al., J. Org. Chem., 59, 1994, 6671, from $Bu_3SnH$, or by Zard et al. in Tetrahedron Letters, 37, 1996, 5877, from propanol, for converting the xanthate to a hydrogen atom.

In the context of the invention, the preferred block polymers of use are polymers with a dithoester, dithiocarbamate or xanthate ending, preferably a dithioester ending.

In the block copolymers described above, the preferred block copolymers are those which exhibit a low absorption at wavelengths of 248 nm or 193 nm.

The solvent of use in the composition of the invention is an organic solvent which makes it possible to dissolve all the constituents of the composition in order to obtain a homogeneous solution which makes it possible to obtain a uniform photoresist layer. Solvents of use for the invention are, for example, butyl acetate, xylene, acetone, ethylene glycol monomethyl ether, diglyme or dichloroethane, alone or as a mixture.

The photoactive compound of use in the composition of the invention is a compound which generates an active species during exposure to radiation. These photoactive compounds are generally acid generators. These compounds are, for example, diazonium salts, perhalomethylated triazines, diaryliodonium salts, triarylsulphonium salts, triarylselenonium salts or nitrobenzyl esters. The counterions for these salts can be tetrafluoroborate, hexafluoroantimonate, hexafluoroarsenate, hexafluorophosphate, tosylate or triflate. It is also possible to use, as photoactive compound, fluorinated sulphonylimide compounds and fluorinated sulphonylmethylide compounds, the associated cation of which is composed of biaryliodonium, arylsulphonium, arylacylsulphonium or diazonium groups. Patent U.S. Pat. No. 5,554,664 discloses photoactive salts composed of a fluorinated anion of $(RfSO_2)_3C^-$ or $(RfSO_2)_2N^-$ type, Rf representing a highly fluorinated alkyl or aryl group, for example $CF_3$ or $C_4F_9$, and of a cation chosen from substituted or unsubstituted aromatic compounds derived from arene or cyclopentadienyl ligands or chosen from onium compounds based on I—, P—, C— or S—.

When the composition of the invention is intended for an exposure of greater than 300 nm, it can be of use to use photoactive compounds as described above which are furthermore substituted by aromatic groups in order to modify their maximum absorption wavelength. It is also possible to add a sensitizer to the composition, in addition to the photoactive compound. These sensitizers can be polycyclic aromatic compounds, for example pyrene or perylene, and acridines.

The composition of the invention can comprise additives which are conventional in the field of lithography.

To obtain a microelectronic system, the composition of the present invention is applied to an appropriate substrate to form a film.

The film thus obtained comprises of the order of 80 to 99.5% by weight of polymer, the remainder being composed of the photoactive compound and the conventional additives.

The coating of the composition can be carried out by any known coating technique, for example by spraying, spin coating, blade coating, and the like.

The film can be subsequently be heated in order to remove the solvent more rapidly.

An image is subsequently formed on the film by exposure to the appropriate radiation, preferably radiation with a wavelength equal either to 248 nm or 198 nm, through a mask.

In the exposed parts, the active species generated, by reaction with the side groups of the block copolymer, converts the hydrophobic block to a hydrophilic block. The film, after exposure, can be heated in order to accelerate the reaction of the active species with the hydrophobic block.

The image thus formed is subsequently developed by means of a basic aqueous solution. By this operation, the polymer now comprising hydrophilic blocks is removed.

An image having a high resolution is thus obtained.

EXAMPLES

Example 1

Synthesis of a Polystyrene in the Presence of a Xanthate of Formula 1

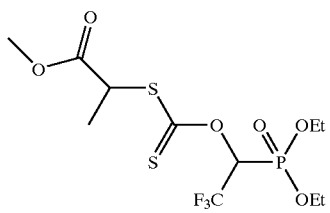

2 g (5.02×10$^{-3}$ mol) of xanthate 1 and 5.24 g of styrene (5.02×10$^{-2}$ mol) are placed in a Carius tube. Three "freezing-vacuum-return to ambient conditions" cycles are carried out on the contents of the tube. The tube is subsequently flame-sealed under vacuum and then the tube is placed in a thermostatically-controlled bath at 125° C. for 48 hours. The tube is subsequently cooled and opened, and its contents are analysed by GPC (THF):

Mn=960 g/mol, Mw/Mn=1.13, Conversion=91%

The crude reaction mixture is subsequently precipitated from ether and dried under vacuum.

Example 2

Synthesis of a poly(styrene)-b-poly(4-acetoxystyrene) diblock copolymer 0.2 g of the polystyrene of Example 1 is dissolved in a solution comprising 10.2 mg of 1,1'-azobis(1-cyclohexanecarbonitrile), 3.38 g (2.08×10$^{-2}$ mol) of 4-acetoxystyrene and 4 ml of xylene in a round-bottomed glass flask surmounted by a reflux condenser and equipped with a magnetic stirrer. The mixture is heated to 100° C. 10.2 mg of 1,1'-azobis(1-cyclohexanecarbonitrile) are added every 10 hours. The reaction is halted after 50 hours. The crude reaction mixture is subsequently analysed by GPC (THF):

Mn=13200 g/mol, Mw/Mn=1.21, Conversion=81%

The crude reaction mixture is subsequently precipitated from ether and dried under vacuum.

Example 3

Synthesis of a poly(styrene)-b-poly(p-tert-butoxycarbonyloxystyrene) diblock copolymer 0.2 g of the polystyrene of Example 1 is dissolved in a solution comprising 10.2 mg of 1,1'-azobis(1-cyclohexanecarbonitrile), 4.59 g of p-tert-butoxycarbonyloxystyrene and 5 ml of toluene in a round-bottomed glass flask surmounted by a reflux condenser and equipped with a magnetic stirrer. The mixture is heated to 100° C. 10.2 mg of 1,1'-azobis(1-cyclohexanecarbonitrile) are added every 10 hours. The reaction is halted after 50 hours. The crude reaction mixture is subsequently analysed by GPC (THF):

Mn=19200 g/mol, MW/Mn=1.20, Conversion=89%

The crude reaction mixture is subsequently precipitated from ether and dried under vacuum.

Example 4

Synthesis of a poly(methyl methacrylate) in the Presence of the dithioester 2 of Formula

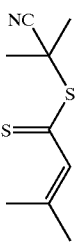

1 g (5×10$^{-3}$ mol) of dithioester 2, 0.4 g of azobisisobutyronitrile, 5 g of MMA (5×10$^{-2}$ mol) and 3 g of toluene are placed in a Carius tube. Three "freezing-vacuum-return to ambient conditions" cycles are carried out on the contents of the tube. The tube is subsequently flame-sealed under vacuum and then the tube is placed in a thermostatically-controlled bath at 60° C. for 20 hours. The tube is subsequently cooled and opened, and its contents are analysed by GPC (THF):

Mn=940 g/mol, Mw/Mn=1.17, Conversion=93%

The crude reaction mixture is subsequently precipitated from pentane and dried under vacuum.

Example 5

Synthesis of a poly(methyl methacrylate)-b-poly(t-butyl methacrylate) diblock 0.4 g of the PMMA of Example 4 are placed in a Carius tube in the presence of 5.43 g of t-butyl methacrylate, 35 mg of AIBN and 3 g of toluene. Three "freezing-vacuum-return to ambient conditions" cycles are carried out on the contents of the tube. The tube is subsequently flame-sealed under vacuum and then the tube is placed in a thermostatically-controlled bath at 60° C. for 20 hours. The tube is subsequently cooled and opened, and its contents are analysed by GPC (THF):

Mn=12100 g/mol,

Mw/Mn=1.19, Conversion=95%

The crude reaction mixture is subsequently precipitated from ether and dried under vacuum.

Example 7

Photoresist Obtained from a poly(methyl methacrylate)-b-poly(t-butyl methacrylate) diblock The polymer of Example 5 is dissolved in diglyme at a solids content of 20%. The catalyst used is triphenylsulphonium hexafluoroarsenate, at a level of 20% by weight with respect to the polymer. A resist film is deposited on a silicon substrate by spin coating at 3000 rev/min. The film is heated at 100° C. for 30 minutes and exposed under UV radiation (dose of 55 mJ/cm$^2$) through a quartz mask. The film is baked at 100° C. for 20 seconds and developed by an aqueous base to give positive images with very good resolution.

Example 8

Photoresists Obtained from a poly(styrene)-b-poly(p-tert-butoxycarbonyloxystyrene) diblock copolymer The polymer of Example 3 is dissolved in a mixture of diglyme and 1,1,2,2-dichloroethane at a solids content of 30%. The catalyst used is diphenyliodonium hexafluoroarsenate, at a level of 20% by weight with respect to the polymer. A small amount of perylene is also added. A resist film is deposited on a silicone substrate by spin coating at 2500 rev/min. The film is heated at 100° C. for 10 minutes and exposed to UV radiation of 365 nm (dose of 25 mJ/cm$^2$). The film is baked at 100° C. for 2 minutes. UV analysis shows the complete cleavage of the pendant groups under the effect of the radiation.

What is claimed is:

1. A photosensitive composition for photoresists, comprising a copolymer with hydrophobic blocks, at least one block of which is a hydrophobic block capable of generating a hydrophilic block, which comprises, at its end, a group selected from the group consisting of dithioesters, thioethers-thiones, dithiocarbamates and xanthates, and a photoactive compound capable of generating, under the effect of radiation, an active species which reacts with the hydrophobic block to generate said hydrophilic block.

2. The composition according to claim 1, wherein the hydrophobic block comprises side groups which, under the action of the active species, are released, generating the hydrophilic block.

3. The composition according to claim 1, wherein the block copolymer is a diblock copolymer, both blocks of which are hydrophobic blocks capable of generating hydrophilic blocks.

4. The composition according to claim 1, wherein the hydrophobic block capable of generating a hydrophilic block under the effect of the active species can be obtained from at least one ethylenically unsaturated monomer selected from the group consisting of (meth)acrylic esters and alkoxystyrenes.

5. The composition according to claim 1, wherein the block copolymer further comprises a hydrophobic block which does not generate a hydrophilic block under the action of the active species.

6. The composition according to claim 1, wherein the block copolymer exhibits a polydispersity index of less than 2.

7. The composition according to claim 1, wherein the photoactive compound is an acid generator.

8. The composition according to claim 7, wherein the acid generator is selected from the group consisting of diazonium salts, perhalomethylated triazines, diaryliodonium salts, triarylsulphonium salts, triarylselenonium salts and nitrobenzyl esters.

9. The composition according to claim 7, wherein the acid generator is an ionic fluorinated sulphonylimide compound or an ionic fluorinated sulphonylmethylide compound, the associated cation of which is composed of biaryliodonium, arylsulphonium, arylacylsulphonium or diazonium groups.

10. The composition according to claim 1, further comprising an organic solvent which makes it possible to form a homogeneous composition.

11. The composition according to claim 1, wherein the block copolymer is present in an amount of between 10 and 40% by weight of the composition.

12. The composition according to claim 1, wherein the block copolymer corresponds to the following formula:

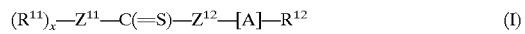

(I)

wherein:
 $Z^{11}$ represents C, N, O, S or P,
 $Z^{12}$ represents S,
 $R^{11}$ and $R^{12}$, which are identical or different, represent:
   (i) an optionally substituted alkyl, acyl, aryl, alkene or alkyne group, or
   (ii) a carbonaceous ring which is saturated or unsaturated and which is optionally substituted or aromatic, or
   (iii) an optionally substituted, saturated or unsaturated heterocycle,
     it being possible for these groups and rings (i), (ii) and (iii) to be substituted by substituted phenyl groups, substituted aromatic groups or the following groups: alkoxycarbonyl, aryloxycarbonyl(—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl, such as alkaline salts of carboxylic acids, alkaline salts of sulphonic acids, poly(alkylene oxide) chains (POE, POP) or quaternary ammonium salts,
 R representing an alkyl or aryl group,
 x corresponds to the valency of $Z^{11}$ or else
 x has a value 0 and, in this case, $Z^{11}$ represents a phenyl, alkene or alkyne radical optionally substituted by an optionally substituted alkyl, acyl, aryl, alkene or alkyne group; a carbonaceous ring which is optionally substituted and which is saturated, unsaturated or aromatic; a heterocycle which is optionally substituted and which is saturated or unsaturated; alkoxycarbonyl, aryloxycarbonyl (—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl or S-aryl groups; alkaline salts of carboxylic acids, alkaline salts of sulphonic acids, poly(alkylene oxide) chains (POE, POP), or quaternary ammonium salts; and
 A represents a polymer chain comprising the hydrophobic block capable of generating a hydrophilic block.

13. The composition according to claim 1, wherein the block copolymer corresponds to the following formulae:

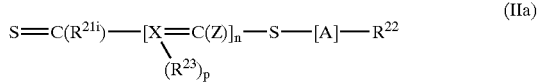

(IIa)

or

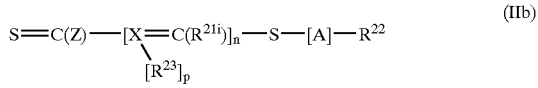

(IIb)

wherein:
 X represents an atom chosen from N, C, P or Si,
 $R^{22}$ represents:
   (i) an optionally substituted alkyl, acyl, aryl, alkene or alkyne group, or
   (ii) a carbonaceous ring which is saturated or unsaturated and which is optionally substituted or aromatic, or (iii) a heterocycle which is saturated or unsaturated and which is optionally substituted or aromatic, it being possible for these groups and rings (i), (ii) and (iii) to be substituted by substituted phenyl groups, substituted aromatic groups or the following groups: alkoxycarbonyl, aryloxycarbonyl(—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl, organosilyl or alkaline salts of carboxylic acids, alkaline salts of sulphonic acids, poly(alkylene oxide) chains (POE, POP) or quaternary ammonium salts, R representing an alkyl or aryl group, Z, R$_{21i}$ and R$^{23}$, which are identical or different, are chosen from:

a hydrogen atom, an optionally substituted alkyl, acyl, aryl, alkene or alkyne group, a carbonaceous ring which is saturated or unsaturated and which is optionally substituted or aromatic, an optionally substituted, saturated or unsaturated heterocycle, alkoxycarbonyl, aryloxycarbonyl (—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl or organosilyl groups, R representing an alkyl or aryl group, alkaline salts of carboxylic acids, alkaline salts of sulphonic acids, poly(alkylene oxide) chains (POE, POP) or quaternary ammonium salts, n>0, i varies from 1 to n, p is equal to 0, 1 or 2, depending upon the valency of X, furthermore, if X=C, then Z is not an S-alkyl or S-aryl group, the R$^{1i}$ group, with i=n, is not an S-alkyl or S-aryl group, A represents a polymer chain comprising the hydrophobic block capable of generating a hydrophilic block.

14. The composition according to claim 1, wherein the block copolymer corresponds to the following formula:

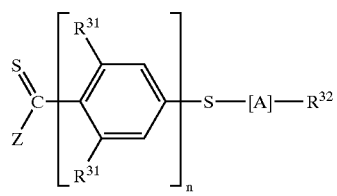

(III)

wherein:

X represents an atom chosen from N, C, P or Si,

R$^{32}$ represents:

(i) an optionally substituted alkyl, acyl, aryl, alkene or alkyne group, or (ii) a carbonaceous ring which is saturated or unsaturated and which is optionally substituted or aromatic, or (iii) a heterocycle which is saturated or unsaturated and which is optionally substituted or aromatic, it being possible for these groups and rings (i), (ii) and (iii) to be substituted by substituted phenyl groups, substituted aromatic groups or the following groups: alkoxycarbonyl, aryloxycarbonyl(—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl, organosilyl or alkaline salts of carboxylic acids, alkaline salts of sulphonic acids, poly(alkylene oxide) chains (POE, POP) or quaternary ammonium salts, R representing an alkyl or aryl group, Z is:

a hydrogen atom, an optionally substituted alkyl, acyl, aryl, alkene or alkyne group, a carbonaceous ring which is saturated or unsaturated and which is optionally substituted or aromatic, an optionally substituted, saturated or unsaturated heterocycle, alkoxycarbonyl, aryloxycarbonyl (—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl or organosilyl groups, R representing an alkyl or aryl group, groups exhibiting a hydrophilic or ionic nature, such as alkaline salts of carboxylic acids, alkaline salts of sulphonic acids, poly(alkylene oxide) chains (POE, POP) or cationic substituents (quaternary ammonium salts), R$^{31}$, which are identical or different, are chosen from:

a hydrogen atom, an optionally substituted alkyl, acyl, aryl, alkene or alkyne group, a carbonaceous ring which is saturated or unsaturated and which is optionally substituted or aromatic, an optionally substituted, saturated or unsaturated heterocycle, alkoxycarbonyl, aryloxycarbonyl (—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl or organosilyl groups, R representing an alkyl or aryl group, alkaline salts of carboxylic acids, alkaline salts of sulphonic acids, poly(alkylene oxide) chains (POE, POP) or quaternary ammonium salts, SR$^{32}$ groups, n>0, and A represents a polymer chain comprising the hydrophobic block capable of generating the hydrophilic block.

15. The composition according to claim 1, wherein the block copolymer corresponds to the following formula:

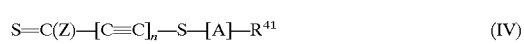

(IV)

wherein:

R$^{41}$ represents:
(i) an optionally substituted alkyl, acyl, aryl, alkene or alkyne group, or
(ii) a carbonaceous ring which is saturated or unsaturated and which is optionally substituted or aromatic, or
(iii) a heterocycle which is saturated or unsaturated and which is optionally substituted or aromatic,
it being possible for these groups and rings (i), (ii) and (iii) to be substituted by substituted phenyl groups, substituted aromatic groups or the following groups: alkoxycarbonyl, aryloxycarbonyl (—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl, organosilyl or alkaline salts of carboxylic acids, alkaline salts of sulphonic acids, poly(alkylene oxide) chains (POE, POP) or quaternary ammonium salts,
R representing an alkyl or aryl group, Z, which are identical or different, are:
a hydrogen atom,
an optionally substituted alkyl, acyl, aryl, alkene or alkyne group,
a carbonaceous ring which is saturated or unsaturated and which is optionally substituted or aromatic,
an optionally substituted, saturated or unsaturated heterocycle, alkoxycarbonyl, aryloxycarbonyl (—COOR), carboxyl (—COOH), acyloxy (—O$_2$CR), carbamoyl (—CONR$_2$), cyano (—CN), alkylcarbonyl, alkylarylcarbonyl, arylcarbonyl, arylalkylcarbonyl, phthalimido, maleimido, succinimido, amidino, guanidino, hydroxyl (—OH), amino (—NR$_2$), halogen, allyl, epoxy, alkoxy (—OR), S-alkyl, S-aryl or organosilyl groups, R representing an alkyl or aryl group,
alkaline salts of carboxylic acids, alkaline salts of sulphonic acids, poly(alkylene oxide) chains (POE, POP) or quaternary ammonium salts,
n>0, and
A represents a polymer chain comprising the hydrophobic block capable of generating a hydrophilic block.

16. The composition according to claim 1, wherein the block copolymer corresponds to the following formula:

$$S=C(OR^{51})-S-[A]-R^{52} \quad (V)$$

wherein:

R$^{51}$ represents:

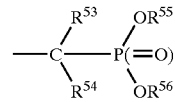

wherein:
R$^{53}$ and R$^{54}$, which are identical or different, are selected from the group consisting of halogen, =O, =S, —NO$_2$, —SO$_3$R, NCO, CN, OR, —SR, —NR$_2$, —COOR, O$_2$CR, —CONR$_2$ or —NCOR$_2$ groups with R representing a hydrogen atom or an alkyl, alkenyl, alkynyl, cycloalkenyl, cycloalkynyl, aryl, optionally condensed with an aromatic or non-aromatic heterocycle, alkylaryl, aralkyl or heteroaryl radical; these radicals can optionally be substituted by one or more identical or different groups chosen from halogens, =O, =S, OH, alkoxy, SH, thioalkoxy, NH$_2$, mono- or dialkylamino, CN, COOH, ester, amide or CF$_3$ or optionally interrupted by one or more atoms chosen from O, S, N or P; or from a heterocyclic group optionally substituted by one or more groups as defined above;
or R$^{53}$ and R$^{54}$ form, together with the carbon atom to which they are attached, a hydrocarbonaceous ring or a heterocycle;
R$^{55}$ and R$^{56}$, which are identical or different, represent a group as defined above for R or together form a C$_2$–C$_4$ hydrocarbonaceous chain optionally interrupted by a heteroatom chosen from O, S and N;
R$^{52}$ has the same definition as that given for R$^{53}$; and
A represents a polymer chain comprising the hydrophobic block capable of generating a hydrophilic block.

17. A system comprising a substrate and a film capable of being obtained from the composition as defined in claim 1.

* * * * *